United States Patent [19]

Sato et al.

[11] Patent Number: 5,609,682
[45] Date of Patent: Mar. 11, 1997

[54] METHOD FOR THE PREPARATION OF SILICON SINGLE CRYSTAL

[75] Inventors: Wataru Sato; Masahiro Sakurada; Ohta Tomohiko; Katsuhiko Kemmochi, all of Fukushima-ken, Japan

[73] Assignees: Shin-Etsu Handotai Co., Ltd.; Shin-Etsu Quartz Co., Ltd., both of Tokyo, Japan

[21] Appl. No.: 498,894

[22] Filed: Jul. 6, 1995

[30]    Foreign Application Priority Data

Jul. 6, 1994   [JP]   Japan .................................. 6-154576

[51] Int. Cl.⁶ ........................................................ C30B 15/10
[52] U.S. Cl. ........................................................ 117/2; 117/19
[58] Field of Search .................................. 117/2, 13, 19, 117/208, 220, 927; 164/39

[56]    References Cited

U.S. PATENT DOCUMENTS 5,053,359  10/1991  Loxley et al. .................. 501/4
5,389,582   2/1995  Loxley et al. .................. 501/4

FOREIGN PATENT DOCUMENTS 0419044  3/1991  European Pat. Off. .
0463543  1/1992  European Pat. Off. .

OTHER PUBLICATIONS

Patent Abstracts Of Japan, vol. 16, No. 329, (C–093), 17 Jul. 1992.
Patent Abstracts Of Japan, vol. 12, No. 444, (C–545), 22 Nov. 1988.
Patent Abstracts Of Japan, vol. 14, No. 446, (C–763), 25 Sep. 1990.
Patent Abstracts Of Japan, vol. 16, No. 356, (C–969), 31 Jul. 1992.

*Primary Examiner*—R. Bruce Breneman
*Assistant Examiner*—Felisa Garrett
*Attorney, Agent, or Firm*—Wenderoth, Lind & Ponack

[57]    ABSTRACT

An improved method is proposed for the preparation of a semiconductor silicon single crystal of N-type by the Czochralski process, which is free from the problem of occurrence of delayed OSFs as defects in the single crystal even after prolonged storage at room temperature based on the discovery that presence of a certain amount of aluminum in the melt of silicon contained in a fused silica glass crucible acts to suppress occurrence of delayed OSFs as a type of defects in the single crystal while copper as an impurity acts adversely in this regard. With a known fact that an about 30 μm thick inner surface layer of the crucible is melted down into the silicon melt during the single crystal pulling-up process, namely, the invention proposes use of a crucible of which the inner surface layer of 30 μm thickness contains aluminum in an average concentration of 40 to 500 ppm by weight while the content of copper is as low as possible not to exceed 0.5 ppb by weight. Alternatively, when the fused silica glass crucible is deficient in the content of aluminum, an amount of aluminum is introduced as a dopant into the melt of silicon in the crucible to supplement the content of aluminum in order to be sufficient to suppress delayed OSFs.

3 Claims, 3 Drawing Sheets

○ : no OSF;  ● : OSF detected

METHOD FOR THE PREPARATION OF SILICON SINGLE CRYSTAL

BACKGROUND OF THE INVENTION

The present invention relates to an improvement in the method for the preparation of a semiconductor silicon single crystal or, in particular, N-type semiconductor silicon single crystal by the Czochralski method and a fused silica glass crucible used therefor.

As is well known, semiconductor silicon single crystals are mostly prepared by the so-called Czochralski method or pulling-up method in which a silicon single crystal as growing on the lower end of a seed crystal is pulled up from a melt of high-purity silicon formed by melting polycrystalline silicon in a crucible of fused silica glass. One of the problems in the silicon single crystal prepared by this crystal growing method is that so-called "oxidation-induced stacking fault", referred to as OSF hereinafter, are sometimes found therein. These OSFs are very detrimental in the subsequent manufacturing process of integrated circuit devices and the like from wafers of the silicon single crystal resulting in a great decrease in the yield of acceptable products of integrated circuits and the like so that it is eagerly desired to develop a method by which silicon single crystals absolutely free from occurrence of OSFs can be grown.

As an approach to accomplish a decrease in the density of OSFs to a significant extent, proposals have been made in recent years for the use of polycrystalline silicon having a still higher purity than heretofore as well as materials of the structure of the pulling-up furnace having an extremely high purity, improvements in the conditions for crystal growing and use of a fused silica glass crucible having the highest purity available.

In connection with the above described problem due to occurrence of OSFs, an interesting phenomenon has come to the attention of the artisan in an N-type silicon single crystal, which is a semiconductor silicon doped with a dopant of the Vth-Group elements in the Periodic Table such as phosphorus, antimony, arsenic and the like, that, when a silicon single crystal absolutely free from OSFs by the inspection immediately after completion of the crystal growing is kept standing as such, i.e. in the form of a single crystal rod, for a certain length of time or, for example, for one month or longer at room temperature, a large number of OSFs are sometimes detected by the subsequent inspection. This phenomenon is referred to as the delayed OSF hereinafter. Though not well understood, it is a presumable mechanism of this phenomenon of delayed OSF that the impurities contained in the starting single crystal rod in a very trace amount cause diffusion through the single crystal rod during storage at room temperature to form aggregates which serve as the nuclei for the occurrence of OSFs. As a consequence of the presumption of the mechanism, proposals have been made by the inventors in Japanese Patent Kokai 5-58800 to avoid the phenomenon of delayed OSF according to which the single crystal rods are stored at a temperature as low as possible to retard diffusion of impurities or the single crystal rods are sliced into wafers as early as possible so as to block the diffusion.

The above proposed methods, however, are nothing more than a method for the prevention or retardation of the delayed OSFs in a silicon single crystal having inherency toward occurrence of OSFs sooner or later providing no fundamental solution of the problem if not to mention the secondary problems unavoidable therein that the low-temperature storage of silicon single crystal rods is a very expensive way to significantly increase the production costs and the early slicing of the single crystal rods into wafers is accompanied by great difficulties in the production planning and storage of the wafers as sliced. Therefore, a complete solution of the OSF problem can be obtained only by the establishment of a method for the preparation of a silicon single crystal which is free not only from occurrence of OSFs immediately after single crystal growing but also from the delayed OSFs even after a prolonged storage of the single crystal rods as grown at room temperature.

SUMMARY OF THE INVENTION

The present invention accordingly has an object, in view of the above described problems in the prior art, to provide a means for the preparation of a semiconductor silicon single crystal, in particular, of the N-type which is free not only from occurrence of OSFs immediately after single crystal growing but also from the delayed OSFs even after a prolonged storage of single crystal rods as grown at room temperature. According to the invention, this object of the invention can be accomplished by the control of the distribution profile of specific impurities within the walls of the fused silica glass crucible in which polycrystalline silicon is melted to form a melt from which a silicon single crystal rod is pulled up by the Czochralski method.

Thus, the present invention provides an improvement in the method for the preparation of a semiconductor silicon single crystal by the Czochralski method, in which a silicon single crystal rod is pulled up on the lower end of a seed crystal from a melt of silicon prepared by melting polycrystalline silicon in a fused silica glass crucible, the improvement comprising use of a fused silica glass crucible having such distribution profiles of aluminum and copper as impurities in the direction of the wall thickness of the crucible that the average concentration of aluminum is in the range from 40 to 500 ppm by weight in the surface layer of 30 μm thickness from the inner surface of the crucible and not exceeding 40 ppm by weight within the layer adjacent to the surface layer in the depth of from 30 μm to 1 mm from the inner surface of the crucible and the average concentration of copper does not exceed 0.5 ppb by weight within the layer from the inner surface to the outer surface of the crucible.

The invention proposes a further improvement in the above described Czochralski process for growing of a silicon single crystal, which comprises using a fused silica glass crucible containing aluminum and copper as impurities in concentrations lower than 40 ppm by weight and not exceeding 0.5 ppb by weight, respectively, and adding aluminum as a dopant to the melt of silicon in the crucible in such an amount that the total amount of the added dopant aluminum and the aluminum impurity contained in the inner surface layer of the crucible of 30 μm thickness from the inner surface is equal to the amount obtained by multiplying the amount of the fused silica glass of the 30 μm thick inner surface layer by the aluminum concentration in the range from 40 ppm by weight to 500 ppm by weight.

DETAILED DESCRIPTION OF THE PREFERRED EMBODIMENTS

Figure 1:
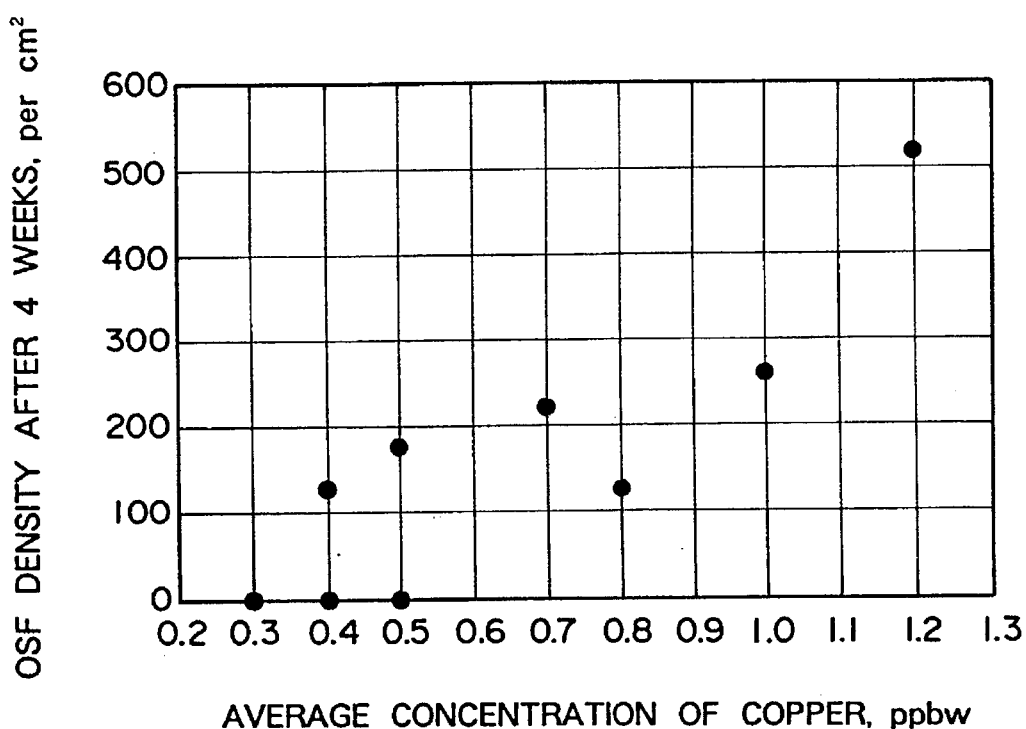
FIG. 1 is a correlation diagram showing the relationship between the average concentration of copper in fused silica glass crucibles and the OSF density in a silicon single crystal grown therefrom after 4 weeks storage.

With an object to provide a solution for the above described problems, the inventors have first directed their attention to the sources from which the metallic impurities taken into the silicon single crystals grown by the Czochralski method originate. While extensive investigations have been undertaken heretofore for various sources of possibility from which the metallic impurities originate, it is an understanding in recent years that, in view of the accomplishment of the extremely high purity not only in the polycrystalline silicon as the starting material but also materials constructing the Czochralski furnace, what should be investigated as a major impurity source is the impurities contained, even though the concentration thereof is extremely low, in the fused silica glass crucible used in the Czochralski method since the inner surface layer of the crucible is more or less melted down into the melt of silicon. As a consequence of the detailed investigations on the relationship between the impurity contents in the fused silica glass crucible and occurrence of the delayed OSFs in a silicon single crystal grown by using the crucible, following criteria have been found that:

1) a positive correlation is found between the average concentration of copper in the crucible and occurrence of OSFs in the silicon single crystal grown therefrom so that the average concentration of copper in the crucible must be 0.5 ppb by weight or lower;

2) aluminum acts as an indispensable constituent in the melt of silicon for suppression of OSFs so that it is not a sufficient condition that a certain amount of aluminum is contained in the crucible as a whole but a certain amount of aluminum must be melted down into the melt of silicon at an early stage of the single crystal growing process by the Czochralski method; and 3) quite satisfactory results can be obtained only as a synergistic effect of these requirements for the contents of copper and aluminum.

As to the influences of the other impurity elements than copper and aluminum, as investigated so far, no correlation has been found between the content of each element and occurrence of delayed OSFs provided that the concentration of the impurity element in the crucible does not exceed 1 ppm by weight as is the case in most of the fused silica glass crucibles currently under practical use.

The above described findings have led the inventors to the establishment of the present invention, of which the basic scope consists in that: 1) the average concentration of copper as an impurity in the fused quartz glass crucible as a whole must be as low as possible; and 2) the concentration of aluminum must have such a distribution profile that the concentration thereof is high in the vicinity of the inner surface of the crucible walls coming into contact with the melt of silicon during the single crystal growing process, the concentration of aluminum elsewhere being low. The uniqueness of the present invention consists in the discovery that a fused silica glass crucible of an ultimately high purity is not a requirement in respect of the delayed OSF at least relative to the content of aluminum.

In particular, the requirement for the distribution profile of aluminum and copper in the direction of the wall thickness in a fused silica glass crucible is that the average concentration of aluminum is in the range from 40 to 500 ppm by weight in the surface layer of 30 μm thickness from the inner surface of the crucible walls and not exceeding 40 ppm by weight within the layer adjacent to the surface layer in a depth of from 30 μm to 1 mm from the inner surface of the crucible and the average concentration of copper does not exceed 0.5 ppb by weight within the layer from the inner surface to the outer surface of the crucible.

Alternatively to the use of the above specified fused silica glass crucible in the preparation of a silicon single crystal by the Czochralski method, the invention also proposes a method in which the melt of silicon contained in a fused silica glass crucible, which has a very low concentration of aluminum in the inner surface layer, is doped with aluminum in such an amount as to be equivalent to the amount which could be taken into the melt assuming that the distribution profile of aluminum in the fused silica glass crucible be according to the above described requirement.

When this alternative method is undertaken, the amount of aluminum dopant W, which should be equal to the amount melted down into the melt of silicon from a crucible containing aluminum in the inner surface layer, to be introduced into the melt of silicon in an aluminum-deficient crucible, of which the concentration of aluminum in the inner surface layer is lower than 40 ppm by weight, can be estimated by calculation by taking into account the following equation:

$$W = A \times t \times \rho \times C,$$

in which W is the amount of aluminum to be introduced into the melt of silicon from an aluminum-containing crucible; A is the area of the surface on which the melt of silicon is in contact with the crucible walls; t is the thickness of the layer which is melted in the single crystal growing process; ρ is the density of the fused silica glass crucible; and C is the average concentration of aluminum in the layer of the crucible walls to be melted down into the melt during the process. Namely, the amount of the aluminum dopant to be added to the melt is the difference between the value W when C in the above given equation is 40 to 500 ppm by weight and the value of W when C is the actual concentration of aluminum in the inner surface layer of the crucible.

In the following, the present invention is described in more detail.

It should be noted that the impurity contents in conventional fused silica glass crucibles currently under use in the Czochralski process for the single crystal growing of semiconductor silicon are so low for each of impurity elements that occurrence of OSFs in the silicon single crystal at least as grown can be almost completely prevented. For example, the average concentration of aluminum and copper are 12 ppm by weight or less and 0.5 ppb by weight or less, respectively. Nevertheless, the phenomenon of delayed OSF frequently takes place in the silicon single crystals grown by using such a high-purity fused silica glass crucible. To the contrary to the generally accepted understanding therefore that the reason for the delayed OSF must be sought in other factors than the impurity contents in the fused silica glass crucible, the unique and novel discovery leading to the present invention is that, while the content of copper in the crucible should be as low as possible, the average concentration of aluminum in the crucible walls must not be so low as in the conventional fused silica glass crucibles but must be at a certain level within the surface layer of the crucible walls in order to fully prevent the undesirable phenomenon of delayed OSF, in particular, in the N-type silicon single crystals grown from the crucible.

FIG. 1 of the accompanying drawing is a correlation diagram between the average concentration of copper in ppb by weight within the body of the fused silica glass crucible and the density of OSFs found in the silicon single crystals grown by using the respective crucibles after storage for 4 weeks at room temperature. As is clear from this diagram, a positive correlation is found between these two parameters so that the concentration of copper must be as low as possible in order to minimize occurrence of delayed OSFs although no critical copper concentration can be given since, even when the copper concentration is 0.5 ppb by weight or lower, occurrence of delayed OSFs cannot be completely prevented.

Figure 2:
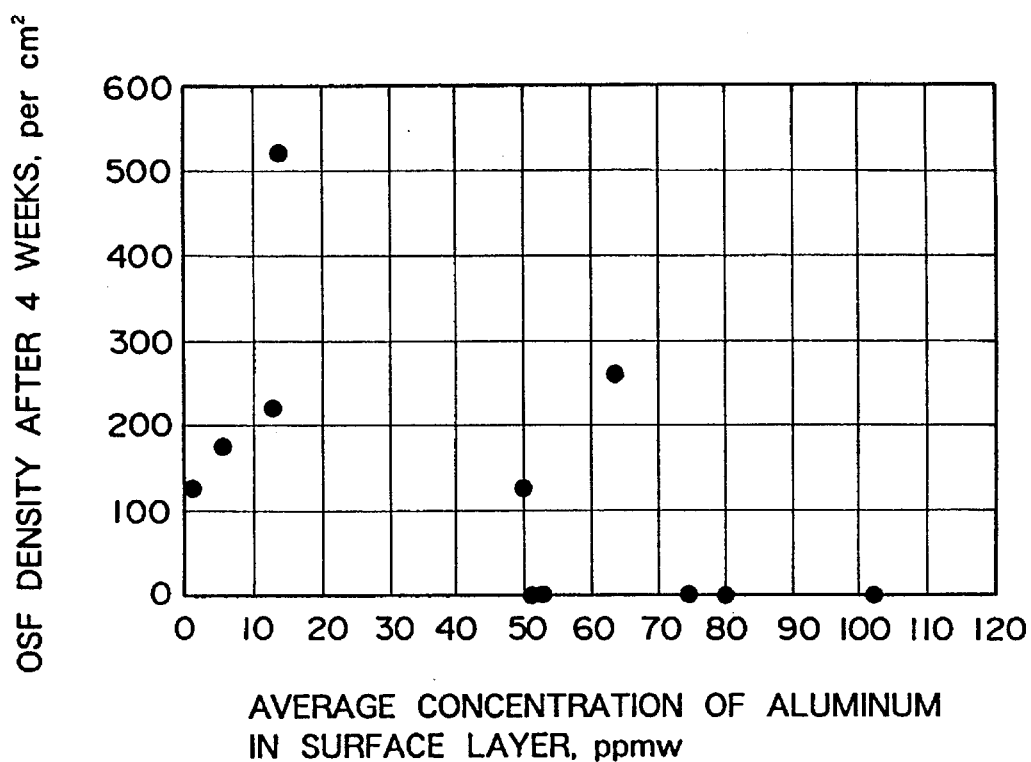
FIG. 2 is a correlation diagram showing the relationship between the average concentration of aluminum in the inner surface layer of fused silica glass crucibles and the OSF density in a silicon single crystal grown therefrom after 4 weeks storage.

FIG. 2, on the other hand, is a correlation diagram between the average concentration of aluminum in ppm by weight within the 30 μm thick inner surface layer of the fused silica glass crucible and the density of OSFs found in the silicon single crystals grown by using the respective crucibles after storage for 4 weeks at room temperature. As is clear from this diagram, a negative correlation is found between these two parameters.

Figure 3:
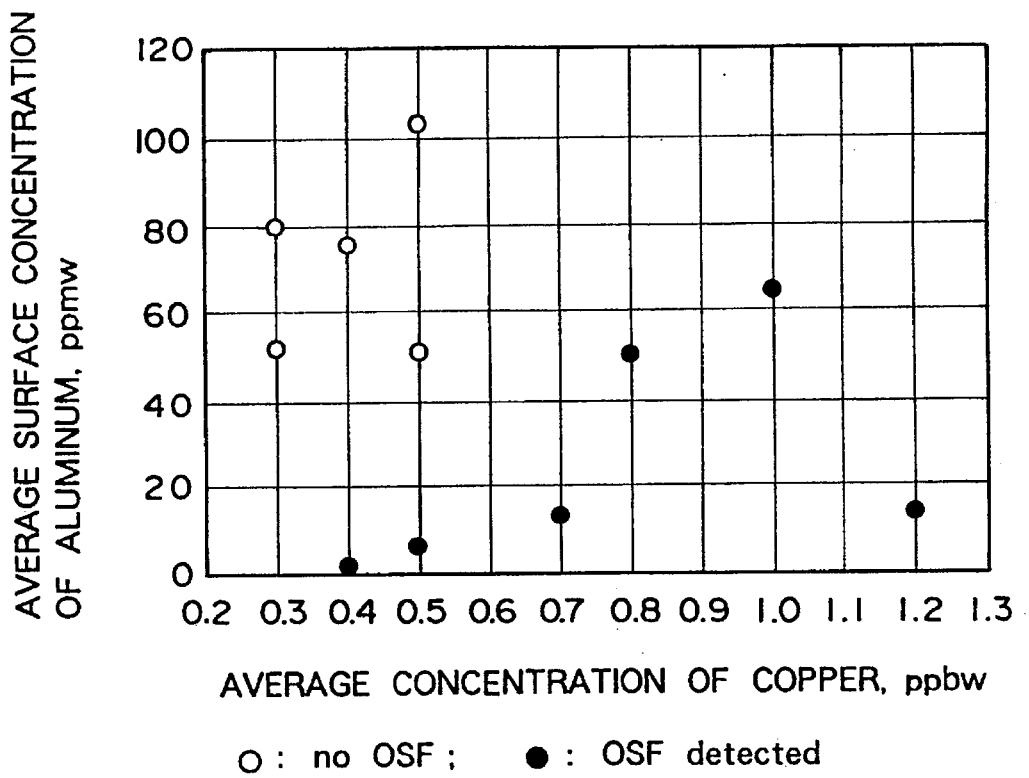
FIG. 3 is a correlation diagram showing the relationship between the average concentration of copper and average surface concentration of aluminum in fused silica glass crucibles in grouping for absence and occurrence of OSFs in silicon single crystals without or with OSFs grown from the crucible and stored for 4 weeks.

The experimental results leading to the above described correlation studies has been further developed to the correlation study between the concentration of copper in the bulk of the crucible and the concentration of aluminum in the inner surface layer of the crucible giving the correlation diagram shown in FIG. 3 in which the plots of filled and open circles correspond to those silicon single crystals which suffered and did not suffer, respectively, from occurrence of delayed OSFs. This result has led to a conclusion that the average concentration of copper in the bulk of the fused silica glass crucible must not exceed 0.5 ppb by weight while the concentration of aluminum in the inner surface layer of the crucible must be at least 40 ppm by weight in order to almost completely prevent occurrence of the delayed OSF in the single crystal of silicon grown from the crucible.

The above obtained conclusion means that an N-type silicon single crystal which is absolutely free from occurrence of delayed OSFs could be obtained when the content of copper impurity in the N-type single crystal be ultimately decreased so as to avoid diffusion and aggregation thereof in the single crystal while the concentration of aluminum, which supposedly has an effect of suppressing the delayed OSF, in the single crystal be kept at a certain level.

Accordingly, the present invention proposes the use of a fused silica glass crucible which, instead of having a uniformly decreased concentration of each impurity element, has such a specific distribution profile of the impurity concentrations relative to copper and aluminum that the average concentration of copper throughout the crucible body is as low as possible or, desirably, 0.5 ppb by weight or lower while the concentration of aluminum is kept at a certain level at least in the inner surface layer of the crucible walls. It is noted here that aluminum acts as a P-type dopant in the silicon single crystals so that the content of aluminum in an N-type silicon single crystal must be limited not to exceed a certain upper limit since otherwise difficulties are caused in the control of the resistivity of the semiconductor silicon. This consideration has led to the completion of the present invention according to which the fused silica glass crucible should have such a distribution profile of aluminum in the direction of wall thickness of the crucible that the average concentration of aluminum is in the range from 40 to 500 ppm by weight or, preferable, from 50 to 150 ppm by weight in the surface layer of 30 μm thickness from the inner surface of the crucible walls and not exceeding 40 ppm by weight or, preferably, 10 ppm by weight within the layer adjacent to the surface layer in a depth of from 30 μm to 1 mm from the inner surface of the crucible.

As to the impurity elements other than copper and aluminum in the fused silica glass crucible, no definite correlation has been found between the concentration of each impurity element and occurrence of delayed OSFs in so far as the impurity concentration is within the range in the conventional fused silica glass crucibles so that it makes no matter whether the concentrations of these impurity elements are conventional or somewhat higher although it is a desirable way to use a crucible having a purity as high as possible also relative to these impurity elements other than copper and aluminum.

As is mentioned above, the concentration of copper in question is the average concentration throughout the body of the fused silica glass crucible while the concentration of aluminum must be controlled by way of the distribution profile relative to the inner surface layer of the crucible walls which is lost by melting down into the melt of silicon contained in the crucible up to the moment of completion of the single crystal growing process by the Czochralski method. This differentiation between copper and aluminum is due to the difference in the mobility of the respective impurity elements within the fused silica glass. Namely, aluminum is relatively immobile not to cause diffusion in the silica glass during the single crystal growing process so that the distribution profile thereof is unchanged throughout the process while copper has a relatively high mobility in the silica glass to cause diffusion so that control of the distribution profile has no particular significance due to the change before the start and after completion of the single crystal growing process. Namely, it is important that aluminum is concentrated by segregation in the inner surface layer of the crucible while the concentration of the copper impurity is kept as low as possible as an average value for the whole crucible body (see Japanese Patent Kokai 4-108683).

Following is a description of the procedure for the preparation of a fused silica glass crucible having the above mentioned unique distribution profile of the impurity concentrations relative to copper and aluminum according to the present invention.

As is disclosed in Japanese Patent Kokai 63-166791, it is the prior art when a fused silica glass crucible from natural quartz having an ultra-high purity is desired that the aluminum impurity deposited or accumulated on the inner surface of the crucible during fusion of the crucible is removed. In the absence of understanding of the exact mechanism for the segregation of aluminum, this is the only possible way to ensure a high purity relative to aluminum because of the non-availability of any effective means to prevent accumulation of aluminum. Such a procedure to subsequently remove the impurity accumulated on the inner surface of the fused silica glass crucible is generally applicable to other impurity elements to cause surface segregation in the manufacture of fused silica glass crucibles from natural quartz as the starting material.

The inventors conducted two test procedures for the Czochralski growing of N-type silicon single crystals by using, one, a fused silica glass crucible prepared from natural quartz and subsequently purified to an ultimately high purity by the above described method and, the other, a crucible of synthetic silica having a still higher purity. To the contrary to the expected results, these silicon single crystals were nothing better or rather worse than the silicon single crystals grown from conventional fused silica glass crucibles in respect of occurrence of delayed OSFs. The investigations undertaken to find the mechanism leading to this unexpected phenomenon have led to a conclusion that the aluminum impurity deposited and accumulated on the inner surface of the crucible walls acts rather suppressingly on the occurrence of delayed OSFs so that the aluminum impurity on the inner surface of the crucible walls should not have been completely removed in order to minimize delayed OSFs. Assuming that the overall amount of the aluminum impurity be identical, it is not sufficient that the aluminum is distributed evenly throughout the crucible walls but it is essential that the aluminum impurity is contained mostly within the layer of about 30 µm thickness from the inner surface of the crucible walls so as to be transferred into the melt of silicon before the start of the single crystal pulling-up process from the melt. As the other impurity elements in the fused silica glass crucibles, no particular adverse influences have been found thereby on the occurrence of delayed OSFs excepting for copper of which the concentration must not exceed 0.5 ppb by weight as an average over the whole body of the crucible in order to prevent occurrence of delayed OSFs in an N-type silicon single crystal grown from the crucible.

In the manufacturing process of a fused silica glass crucible from natural quartz, a powder of natural quartz is first washed with a mixture of hydrofluoric acid and nitric acid and then subjected to a heat treatment at 1000° C. to 1300° C. in an atmosphere containing hydrogen chloride and chlorine in combination followed by a second acid washing with hydrofluoric acid so that the content of copper in the powder is decreased to 0.3 ppb by weight or lower after the treatments to give a high-purity quartz powder. It is known that these treatments have no effect to decrease the content of the IIIB-Group elements on the Periodic Table such as aluminum so that the concentration of aluminum of, e.g., 12 ppm by weight before the treatments is retained as such after the treatments. Alkali metals, iron and nickel are among those impurity elements which can be particularly removed from the quartz powder by these treatments.

The thus purified quartz powder is deposited on the wall of a mold rotating around the vertical axis and the deposition of the powder is heated from inside to effect fusion and vitrification into the form of a fused silica glass crucible. When the temperature on the inner surface of the thus molded crucible is about 2200° C., it has been found that gradual accumulation of aluminum takes place so that the average concentration of aluminum in the inner surface layer of 30 µm thickness reaches about 50 ppm by weight. If the heating is continued at 2300° C. for 5 minutes or longer, a further increase of the aluminum concentration gradually proceeds so that the average concentration of aluminum within the inner surface layer reaches about 300 ppm by weight. Prolongedly continued heating at this temperature to exceed 30 minutes results in an increase in the concentration of aluminum in the layer at 40 µm or deeper from the inner surface of the crucible due to the diffusion of aluminum so that the crucible thus prepared cannot meet the object of the present invention. It is of course that the temperature of the fusion and vitrification and length of time therefor in the manufacture of the crucible should be adequately selected depending on the dimensions of the crucibles because the required amount of surface segregation of aluminum depends on the amount of charge of polycrystalline silicon into the crucible.

According to the scope of the present invention, it is important that a certain amount of aluminum is taken into the melt of silicon before the start of the single crystal pulling-up process and subsequently no substantial increase is caused in the concentration of aluminum in the melt. This is the reason for the requirement that the necessary amount of aluminum should be accumulated within the 30 µm thick layer on the inner surface of the crucible walls because the thickness of the layer of the crucible walls which is lost by melting down into the melt of silicon before the start of the single crystal growing process rarely exceeds 30 µm. It is of course optional that the aluminum-segregation layer has a thickness smaller than 30 µm if it is confined within the 30 µm thick layer from the inner surface of the crucible although a remedial means can be undertaken even if the aluminum-segregation layer is not confined within the 30 µm thick layer from the inner surface, for example, by extending the time for keeping the melt of silicon in the crucible before the start of the single crystal pulling-up procedure because, in essence, the requirement is that the necessary amount of aluminum has been taken into the melt of silicon before the start of the single crystal pulling-up procedure.

When the fused silica glass crucible in itself has no segregation layer of aluminum on the inner surface or the average concentration of aluminum is lower than 40 ppm by weight in the inner surface layer of 30 µm thickness as is the case in a crucible prepared from natural quartz and having the aluminum-segregation layer completely removed or a crucible of a synthetic silica glass inherently containing only an extremely small amount of aluminum, it is necessary according to the invention that the inner surface of the crucible is provided with a deposition of a coating layer doped with aluminum in an amount to meet the requirement for the prevention of the phenomenon of delayed OSF in the silicon single crystal grown from the crucible. The thickness of this additional aluminum-doped coating layer is about 5 µm in order not to cause falling from the crucible surface. Needless to say, the amount of aluminum contained in the inner surface layer of the crucible is adequately adjusted so as to ensure a necessary concentration of aluminum in the melt of silicon because the proportion of the volume of the silicon melt contained in the crucible and the area of the crucible surface coming into contact with the melt depends on the dimensions of the crucible. Doping of the fused silica glass crucible with aluminum can be conducted by the method of putting an aluminum dopant material on the bottom of the crucible before the crucible is charged with blocks of polycrystalline silicon or by the method in which an aluminum dopant is introduced into the melt of silicon in the Czochralski furnace by means of a specific instrument. Incidentally, the fused silica glass crucible having the specified distribution profiles of the concentrations of aluminum and copper according to the present invention can be used without any detrimental effects in the Czochralski growing of a P-type silicon single crystal.

The amount of the aluminum dopant to be used in the above mentioned doping method should be equivalent to that of aluminum which should be taken into the melt when the fused silica glass crucible assumedly has an inner surface layer containing aluminum in the specified concentration. Thus, the amount W of the dopant aluminum is given by taking into account the following equation:

$$W = A \times t \times \rho \times C,$$

in which W is the amount of aluminum introduced into the melt of silicon from an aluminum-containing crucible; A is the area of the surface on which the melt of silicon is in contact with the crucible walls; t is the thickness of the layer which is melted down in the single crystal growing process; $\rho$ is the density of the fused silica glass crucible; and C is the average concentration of aluminum in the layer of the crucible walls to be melted down into the melt during the process. Namely, the amount of the dopant aluminum to be added is the difference between the amount W when C is in the range from 40 to 500 ppm by weight and the amount of W when C is the actual concentration of aluminum in the inner surface layer.

In the following, the present invention is described in more detail by way of examples and comparative examples showing some typical cases.

EXAMPLE 1

A fused silica glass crucible, referred to as the crucible A hereinafter, having an inner diameter of 18 inches was prepared. The crucible A was prepared from a high-purity powder of natural quartz, after a heat treatment at 1200° C. in an atmosphere of hydrogen chloride and chlorine, by fusion and vitrification at 2300° C. so as to have a segregation layer of aluminum on the inner surface. Table 1 below shows the analytical results of the contents of 9 impurity elements including aluminum and copper. The concentration of aluminum is given in two ways of, one, for the concentration in the surface layer of 30 μm thickness from the inner surface of the crucible, referred to as the surface concentration in the table, and, the other, for the concentration in the layer adjacent thereto in a depth of 30 μm to 1 mm from the inner surface, referred to as the bulk concentration in the table, while the contents of the other impurity elements are given as an average from the whole volume of the crucible. The units of the numerical values in the table are ppmw (ppm by weight) for aluminum and ppbw (ppb by weight) for the other impurity elements.

The analytical method for the determination of the concentration of aluminum was as follows. For the determination of the surface concentration of aluminum, a 30 μm thick surface layer was dissolved out with a 38% hydrofluoric acid and this acid solution was subjected to the analysis by the atomic absorption spectrophotometric method to determine the relative intensities of light absorption for aluminum and silicon and the concentration of aluminum was obtained by calculation from the relative intensities for a known concentration proportion. Thereafter, the surface layer having a thickness of 1 mm as measured from the initial surface before the above mentioned acid treatment was taken by cutting, of which the bulk concentration of aluminum was determined also by the method of the atomic absorption spectrophotometry.

Using the above described crucible A, a crystal growing test was undertaken according to a standard procedure of Czochralski method in which the crucible was charged with 60 kg of polycrystalline silicon blocks to form a melt by heating, from which a single crystal silicon rod of 6 inches diameter doped with phosphorus and weighing 45 kg was pulled up in the crystallographic orientation of <100> and subjected to the examination of occurrence of OSFs either as grown or after storage for weeks. Incidentally, the polycrystalline silicon as well as the materials of the Czochralski furnace were all of the highest purity-grades available in order to minimize the influences by the foreign impurities not originating in the crucible.

Figure 4:
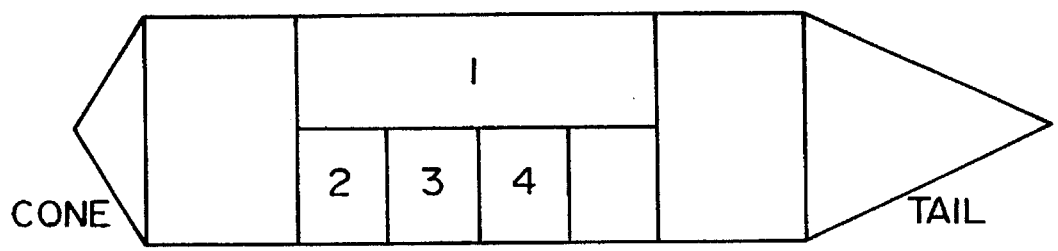
FIG. 4 is a schematic illustration of the four blocks 1 to 4 taken from a silicon single crystal by dividing for the test of OSF.

In conducting the test for OSFs, four blocks 1 to 4 were taken from the thus obtained silicon single crystal rod by dividing according to the schematic illustration in FIG. 4 and each of the blocks was subjected to the test of OSFs after the respective treatment described below.

The block 1 was, immediately after dividing the rod into blocks, sliced into 2 mm thick wafers, each of which was mirror-polished and subjected to a heat treatment in a schedule including a temperature elevation stage from 800° C. up to 1200° C. at a rate of 10° C./minute, constant-temperature stage at 1200° C. in a wet-oxygen condition for 100 minutes, temperature lowering stage down to 800° C. at a rate of 1.5° C./minute and cooling down stage to room temperature. Thereafter, the oxidized surface film on the wafer surface was removed by using hydrofluoric acid and the wafers were subjected to SECCO etching (F. Secco et al., Journal of Electrochemical Society, volume 119, page 984, 1972) for 2 minutes and the density of the OSFs was determined using an optical microscope.

The blocks 2, 3 and 4 were kept standing for storage at 23° C. for 2 weeks, 4 weeks and 6 weeks, respectively, before slicing into 2 mm thick wafers, each of which was subjected to mirror-polishing and the same treatment and test of OSFs as in the block 1. The results of the OSF test were that absolutely no OSFs were detected in any of the wafers taken not only from the block I but also from the blocks 2 to 5 indicating absence of the phenomenon of delayed OSF.

EXAMPLE 2

The experimental procedure was substantially the same as in Example 1 excepting for the use of a fused silica glass crucible, referred to as the crucible B hereinafter, which was prepared from synthetic silica and coated on the inner surface with a layer of aluminum-doped silica glass by the sol-gel method. The contents of the respective impurity elements in the crucible B are shown in Table 1. Absolutely no OSFs were detected not only in the silicon wafers taken from the block 1 as grown but also in the wafers taken from the blocks 2 to 4 after storage at room temperature for up to 6 weeks.

COMPARATIVE EXAMPLE 1

Figure 5:
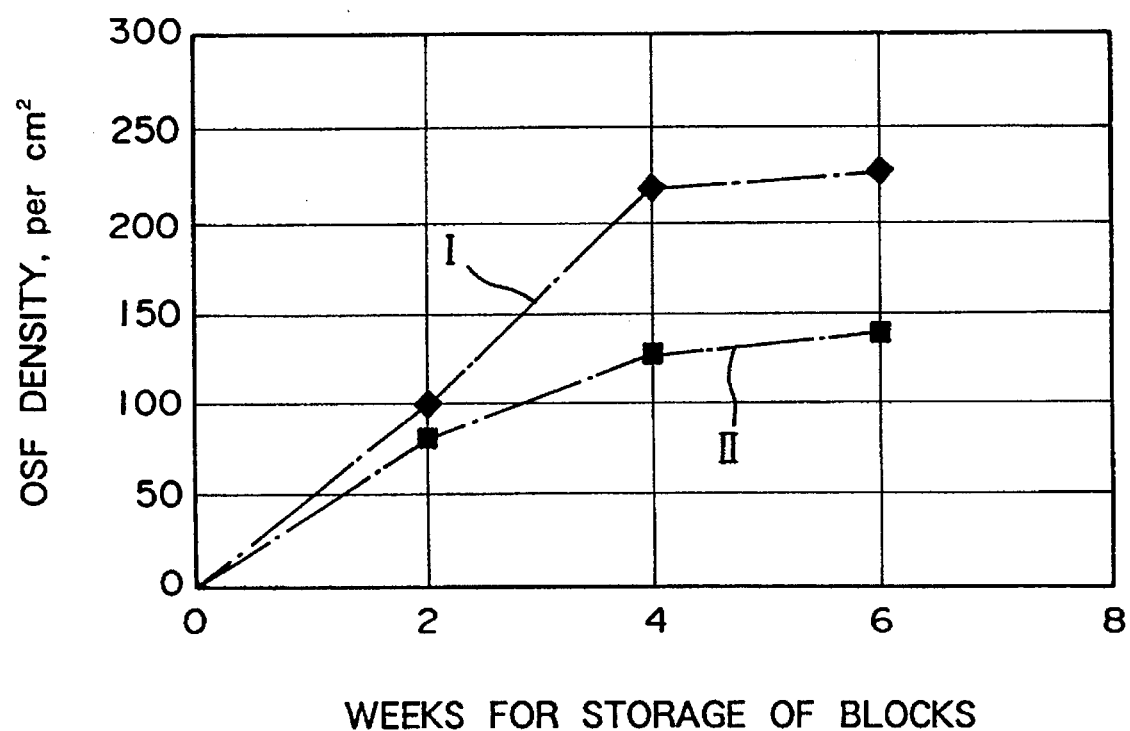
FIG. 5 is a graph showing appearance of delayed OSFs in the silicon single crystals prepared in Comparative Examples 1 and 2 as a function of the storage period of the blocks.

The experimental procedure was substantially the same as in Example 1 excepting for the use of a fused silica glass crucible, referred to as the crucible C hereinafter, which was prepared from conventional natural quartz and contained 1.0 ppb by weight of copper. The contents of the respective impurity elements in the crucible C are shown in Table 1. The microscopic examination for OSFs indicated that, although no OSFs were detected in the wafers taken from the block 1, the density of OSFs was increased in the wafers taken from the blocks 2 to 4 stored at room temperature for up to 6 weeks as is shown in FIG. 5 by the curve I.

COMPARATIVE EXAMPLE 2

The experimental procedure was substantially the same as in Example 1 excepting for the use of a fused silica glass crucible, referred to as the crucible D hereinafter, which was prepared from high-purity synthetic silica. The contents of the respective impurity elements in the crucible D are shown in Table 1. The microscopic examination for OSFs indicated that, although no OSFs were detected in the wafers taken from the block 1, the density of OSFs was increased in the wafers taken from the blocks 2 to 5 stored at room temperature for up to 6 weeks as is shown in FIG. 5 by the curve II.

EXAMPLE 3

The same experimental procedure as in Comparative Example 2 described above was repeated excepting doping of the silicon melt in the crucible with aluminum by introducing 4 mg of a powder of high-purity aluminum metal containing 2 ppm by weight of silicon and 2 ppm by weight of copper into the crucible together with 60 kg of the polycrystalline silicon blocks so that the doping concentration of aluminum in the silicon melt was about 0.07 ppm by weight.

The above mentioned doping amount of aluminum, i.e. 4 mg, was a result of the estimation by calculation in the following manner using the equation:

$$W = A \times t \times \rho \times C,$$

given before assuming $A=3218.82$ cm$^2$ for a 18-inch crucible containing 55 kg of silicon melt, $t=30$ μm, $\rho=2.3$ g/cm$^3$ and $C=40$ ppm by weight or 500 ppm by weight to give a result of $W=0.89$ mg or 11.13 mg, respectively, so that the actual doping amount of aluminum should be somewhere between these two limiting values.

The results of the test for the density of OSFs in the single crystal of silicon grown from the thus aluminum-doped melt were that absolutely no OSFs were detected not only in the wafers taken from the block 1 but also in the wafers taken from the blocks 2 to 5 stored at room temperature for up to 6 weeks indicating no delayed OSFs.

TABLE 1

| Crucible | A | B | C | D |
|---|---|---|---|---|
| Aluminum (ppmw) | | | | |
| surface | 102 | 80 | 250 | <1 |
| bulk | 5 | <1 | 6 | <1 |
| Copper | 0.5 | 0.3 | 1.0 | 0.4 |
| Boron | <200 | <200 | <200 | <200 |
| Nickel | <2 | <2 | <2 | <2 |
| Iron | <200 | <200 | <200 | <200 |

TABLE 1-continued

| Crucible | A | B | C | D |
|---|---|---|---|---|
| Chromium | <20 | <20 | <20 | <20 |
| Sodium | <100 | <100 | <100 | <100 |
| Potassium | <100 | <100 | <100 | <100 |
| Lithium | <300 | <300 | <300 | <300 |
| | | | | (ppbw) |

What is claimed is:

1. In a method for the preparation of a semiconductor silicon single crystal by the Czochralski method, in which a silicon single crystal rod is pulled up on the lower end of a seed crystal from a melt of silicon prepared by melting polycrystalline silicon in a fused silica glass crucible, the improvement which comprises using a fused silica glass crucible having such distribution profiles of aluminum and copper as impurities in the direction of the wall thickness of the crucible that an average concentration of aluminum is in the range from 40 to 500 ppm by weight in a surface layer of 30 μm thickness from an inner surface of the crucible and not exceeding 40 ppm by weight within the layer adjacent to the surface layer in a depth of from 30 μm to 1 mm from the inner surface of the crucible and the concentration of copper does not exceed 0.5 ppb by weight within the layer from the inner surface to the outer surface of the crucible.

2. The improvement as claimed in claim 1 in which the average concentration of aluminum is in the range from 50 to 150 ppm by weight in the surface layer of 30 μm thickness from the inner surface of the crucible and not exceeding 10 ppm by weight within the layer adjacent to the surface layer in a depth of from 30 μm to 1 mm from the inner surface of the crucible.

3. In a method for the preparation of a semiconductor silicon single crystal by the Czochralski method, in which a silicon single crystal rod is pulled up on the lower end of a seed crystal from a melt of silicon prepared by melting polycrystalline silicon in a fused silica glass crucible, the improvement which comprises using a fused silica glass crucible containing aluminum and copper as impurities in concentrations lower than 40 ppm by weight and not exceeding 0.5 ppb by weight, respectively, and adding aluminum as a dopant to the melt of silicon in the crucible in such an amount that the total amount of the added dopant aluminum and the aluminum impurity contained in an inner surface layer of the crucible of 30 μm thickness from the inner surface is equal to the amount of the fused silica glass forming the 30 μm thick inner surface layer of the crucible multiplied by the concentration of aluminum in the range from 40 ppm by weight to 500 ppm by weight.

* * * * *